United States Patent
Bruch et al.

(10) Patent No.: US 9,127,349 B2
(45) Date of Patent: Sep. 8, 2015

(54) METHOD AND APPARATUS FOR DEPOSITING MIXED LAYERS

(75) Inventors: Juergen Bruch, Nidderau (DE); Elisabeth Sommer, Alzenau (DE); Uwe Hoffmann, Alzenau (DE); Manuel Dieguez-Campo, Hanau (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 1570 days.

(21) Appl. No.: 12/342,969

(22) Filed: Dec. 23, 2008

(65) Prior Publication Data
US 2010/0159125 A1 Jun. 24, 2010

(51) Int. Cl.
- C30B 23/02 (2006.01)
- C23C 14/24 (2006.01)
- C23C 14/12 (2006.01)
- C23C 14/22 (2006.01)
- H01L 51/00 (2006.01)
- H01L 51/56 (2006.01)

(52) U.S. Cl.
CPC .............. *C23C 14/24* (2013.01); *C23C 14/12* (2013.01); *C23C 14/225* (2013.01); *C30B 23/02* (2013.01); *H01L 51/001* (2013.01); *H01L 51/0008* (2013.01); *H01L 51/56* (2013.01)

(58) Field of Classification Search
CPC ...... C30B 23/02; C23C 14/225; C23C 14/24; H01L 51/001
USPC .............. 117/84, 88, 89, 98, 105, 107; 427/8, 427/248.1
See application file for complete search history.

(56) References Cited

U.S. PATENT DOCUMENTS

| | | | |
|---|---|---|---|
| 4,740,386 A * | 4/1988 | Cheung | 117/105 |
| 5,415,128 A * | 5/1995 | Kao et al. | 117/98 |
| 6,082,296 A | 7/2000 | Tran | |
| 2006/0008582 A1 * | 1/2006 | Champion et al. | 427/248.1 |
| 2007/0231460 A1 * | 10/2007 | Ukigaya | 427/8 |
| 2008/0254202 A1 | 10/2008 | Stolt et al. | |

FOREIGN PATENT DOCUMENTS

| | | | |
|---|---|---|---|
| EP | 1078999 A2 | 2/2001 | |
| EP | 1197576 A1 | 4/2002 | |
| EP | 1672715 A1 | 6/2006 | |
| JP | 60009143 A * | 1/1985 | H01L 21/86 |
| JP | 03288449 A * | 12/1991 | H01L 21/363 |
| JP | 2003077662 | 3/2003 | |
| WO | WO 9925894 | 5/1999 | |

OTHER PUBLICATIONS

Computer translation of JP 2003-077662 A (2003).*
Patent Abstracts of Japan. English Abstract of JP 60-009143 (2012).*

* cited by examiner

*Primary Examiner* — Matthew Song
(74) *Attorney, Agent, or Firm* — Kilpatrick Townsend & Stockton LLP

(57) ABSTRACT

The present invention refers to a method as well as an apparatus for depositing a layer at a substrate, the layer containing at least two components co-deposited by at least two evaporation sources, wherein the mixture of the components regarding the content of the components is set by tilting the evaporation sources to predetermined angle and/or by positioning the evaporation sources at a predetermined distance with respect to the substrate and/or wherein evaporation plumes of the evaporation sources are arranged such that the maxima of the evaporation plumes are separated locally with respect to the substrate.

15 Claims, 7 Drawing Sheets

METHOD AND APPARATUS FOR DEPOSITING MIXED LAYERS

BACKGROUND OF THE INVENTION

1. Field of the Invention

The present invention refers to a method for depositing a layer at a substrate wherein the layer contains at least two components provided by at least two evaporation sources. Moreover, the present invention refers to an apparatus for depositing such a layer.

2. Prior Art

The use of evaporation sources for producing thin film layers for an organic electroluminescence element is known from EP 1 197 576 A1 or EP 1 078 999 A2. According to this prior art, two or more materials are deposited by a vacuum evaporation. When the two or more materials are simultaneously deposited, to form a layer, a mixture of the components or doping of the layer is achieved. Thus, dopants may be deposited simultaneously with an organic material to form organic layers of an organic light emitting device OLED or an organic photovoltaic device.

EP 1 197 576 A1 describes a method to achieve a homogeneous deposition layer having only small variations in the density of each of the materials, even if large area substrates are coated. This is achieved by adjusting the shape of the crucible of the evaporation sources as well as changing the evaporation rates according to a specific formula.

EP 1 078 999 A2 also describes a system and a method for fabricating organic electroluminescent display devices. Again, highly homogeneous layers with respect to film thickness distribution as well as a constant doping concentration shall be achieved. The solution suggested by EP 1 078 999 A2 comprises usage of a specific rotation system where the substrate is rotated by rotation means during deposition. With respect to such a deposition system, the position of the evaporation source is defined, to achieve the above-mentioned objects. Moreover, it is disclosed that the evaporation sources may be tilted to achieve a satisfactory film thickness distribution for the given rotation evaporation method.

DISCLOSURE OF THE INVENTION

Object Of The Invention

It is an object of the present invention to provide a method as well as an apparatus for fabricating a layer containing at least two components mixed therein. The method as well as the apparatus shall enable to set the composition of the layer composition at a predetermined and defined value. Especially, high concentrations of dopants in organic layers shall be precisely achievable. Moreover, the composition should be adjustable in a broad range in a simple and effective manner. In addition, the apparatus should be easy to manufacture and easy to handle.

Technical Solution

This object is achieved by a method for depositing a layer having the features of claim 1 as well as an apparatus for depositing a layer having the features of claim 12. Advantageous embodiments are subject matter of the dependent claims.

It has been found that a defined composition of a layer comprising two or more components can be easily achieved by evaporation of the components with at least two evaporation sources, if the evaporation plumes of the evaporation sources are arranged such that the maxima of the evaporation plumes are separated locally within a common coating area at the substrate. Up to now in prior art it was thought that a homogeneous mixture of two or more components in a deposited layer may be achieved by bringing the evaporation plumes of the different evaporation sources in coincidence with each other. However, it was surprisingly found that a more defined mixture with respect to the composition of the layer or the concentration of the specific components in the layer may be achieved, if the evaporation plumes of different evaporation sources do not completely coincide, but are separated locally at least partially. Especially, if a deposition area is considered in which the substrate is to be coated the evaporation plumes of the evaporation sources are arranged such that they do not completely coincide in the coating area. In particular, tilting of at least two evaporation sources for variation of the evaporation direction allows for setting of the composition profile of the coating in the thickness direction of the coating. Thus, a gradual variation of the co-evaporated materials perpendicular to the substrate plane may be achieved.

Such concept is especially advantageous for an inline coating process where the substrate is continuously moved with respect to the evaporation sources so that the coating takes place during a movement of the substrate. However, although the inverse case where the evaporation sources are moveable and the substrate is immobile is considerable.

The separation of the evaporation maxima may be achieved by tilting the evaporation source with respect to the substrate. Usually, the opening of the evaporation source is directed towards the substrate so that the orientation of an axis of the opening or an axis perpendicular to the opening area perpendicular to the coating area defines the basic position of the evaporation direction. The tilt angle of the evaporation source may thus be defined as a deviation of the evaporation source from this basic orientation so that the evaporation direction defined by an axis of the evaporation opening or the normal on the opening area differs from the normal of the substrate area to be coated. In other words, the tilt angle of the evaporation source is zero, if the evaporation direction, i.e. the axis of the evaporation opening or the normal of the opening area, is parallel to the normal of the surface to be coated.

In addition, a separation of the evaporation maxima may be achieved by positioning of the evaporation sources at different distances from the substrate. Thus, alternatively or additionally to the setting of the tilting angle of the evaporation source the distance of the evaporation sources to the substrate may be adjusted in order to influence the composition of the deposited layer.

Accordingly, setting of the tilting angle and/or the distance of the evaporation source gives the possibility to vary the composition of a layer deposited by evaporation of at least two components. Especially, the achievable concentration of a dopant to be included in the deposited material can be increased by an appropriate setting of the tilting angle and/or the distance of the evaporation source to the substrate.

Since it is assumed that the advantage of the present method and the according set up of an appropriate apparatus is based on the predominant deposition of one component in most areas of the coating area, the advantageous result may also be achieved by merely setting an appropriate tilting angle as well as adjusting the distance of the evaporation source to the substrate, even if the evaporation maxima are not separated, as long as in most areas of the coating area a predominant deposition of on of the components takes place.

Due to this fact the profiles of the evaporation plumes normally intersect at different positions. To obtain a good mixture of the components in the layer it is advantageous to have the intersection points to coincide at the plane of the substrate.

Due to the tilting of the evaporation sources the profiles of the evaporation plumes may be different.

In addition to a tilting of the evaporation sources different profiles of the evaporation plumes may also be achieved by using different geometries of the evaporation source. Thus, by choosing the appropriate geometry of the evaporation source the setting of the desired composition or concentration of a dopant may also be improved.

Due to a variation of the tilting angle and/or the distance of the evaporation source to the substrate a concentration profile of the components can be set in the layer, for example a gradient with an increasing or decreasing content of a specific component.

Moreover, the deposition rates of the evaporation sources may also be adjusted in order to influence the composition profile of the deposited layer.

In order to achieve variation of the composition in the deposited layer for a moving substrate in an inline continuous coating process the tilting angle and/or the distance may be periodically changed while the substrate is moved with respect to the evaporation sources.

Normally, for each component of the layer a single evaporation source may be used. However, a mixture of components may be evaporated by a single evaporation source so that the number of components contained in the layer and the number of evaporation sources do not have to be equal.

The present method is especially designed for formation of organic layers in layer stacks of an organic light emitting diode OLED, organic electronic device or of an organic photovoltaic device. Especially the content of dopants can be increased and precisely set according to the present method.

An apparatus for carrying out the above described method may comprise at least two evaporation sources being adjustable with respect to the tilt angle and/or the distance of the evaporation sources with respect to the substrate. Moreover, such an apparatus according to the invention contains a control unit which is configured to set tilt angles of the evaporation sources to a predetermined angle and/or distances of the evaporation sources with respect to the substrate. For this purpose the control unit may use additional information on the deposition conditions for example information on the type of evaporation source, geometry of the evaporation source, position of the evaporation source, evaporation material, evaporation rate, evaporation temperature and form of the evaporation plume etc. Based on this information and the input which composition or which concentration of the components is desired, the control unit may automatically set the appropriate tilt angles and/or distances of the evaporation sources.

BRIEF DESCRIPTION OF THE FIGURES

Further advantages, features and characteristics of the present invention may be apparent from the following description of embodiments according to the attached figures. The figures show in a pure schematic way in FIG. 1 a perspective over-all view of a coating chamber which may be used with the present invention.

EMBODIMENTS OF THE INVENTION

Figure 1:
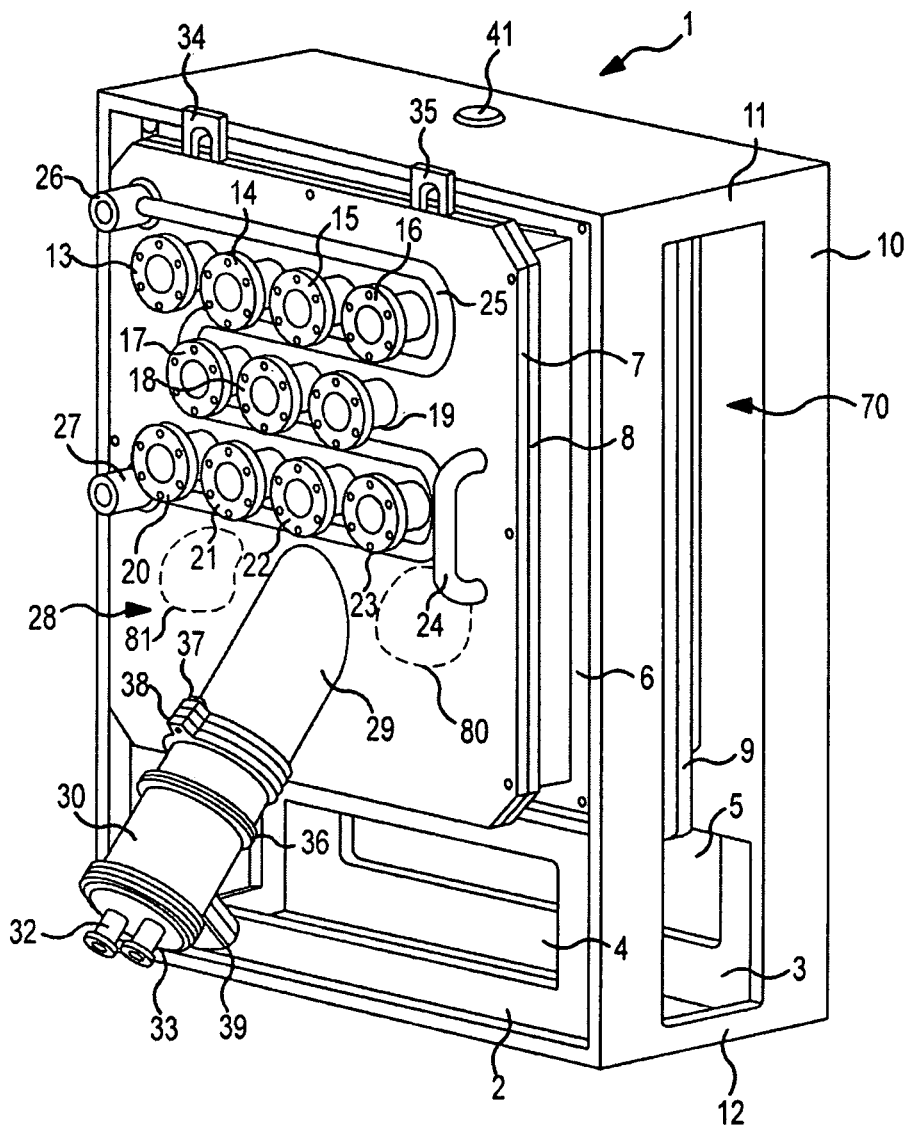

FIG. 1 shows a perspective overall view of coating chamber 1 according to the invention having three vaporizers. One of the vaporizers is shown in FIG. 1, while the others are omitted for sake of clarity. Coating chamber 1 has a front side 2 and rear side 3. Front side 2 is provided with front opening 4 and rear side 3 is provided with rear opening 5 for the introduction of a drive. Front and rear openings 4 and 5 can be closed again after the introduction of a drive. Disposed above front opening 4 is front plate 6, which supports front carrier plate 7 and rear carrier frame 8.

Parts (housing parts) 10, 11, 12 of coating chamber 1 form a housing, which forms a working region with its own housings disposed next to one another, which are not depicted in FIG. 1.

A substrate 9, for example a glass plate, can be moved through the working regions disposed one next to the other and be worked in a manner which is different in each case. The overall installation, not shown here, is thus structured modularly, with the coating chamber 1 representing one of several modules.

It is further understood that, instead of a stationary vaporizer source toward which a substrate is moved, a stationary substrate could also be provided, past which a vaporizer source is guided.

The chamber, in which the substrate 9 is coated, without a process has a base pressure of less than 10.sup.−4 Pa and with a process of less than 10.sup.−2 Pa, with this pressure being a function of the vaporization rates.

Carrier plate 7 and carrier frame 8 are connected with one another, with several flanged measuring tubes 13 to 23 each projecting from front carrier plate 7. For example, the flanged measuring tube 13 may be observation tube having a glass covering, through which substrate 9 may be viewed. In the flanged measuring tube 14, a thermocouple can be disposed, while in flanged measuring tube 15 a quartz oscillator can be disposed, with which the vaporizer rate of the vaporizer source may be measured. Handle 24 may be provided to make it possible to lift carrier plate 7 and carrier frame 8 like a door from the rest of coating chamber 1. Cooling tubing 25 for cooling carrier plate 7 and carrier frame 8 is wound about the flanged measuring tubes) 13 to 23, and specifically such that the cooling tubing extends from connection pipe 26 for cooling fluid above flanged measuring tubes 13 to 16, combined into a first group, and is subsequently guided beneath these flanged measuring tubes 13 to 16 and thus above additional flanged measuring tubes 17 to 19, combined into a second group, and, lastly, beneath a third group of flanged measuring tubes 20 to 23 is connected with a further connection pipe 27 for the cooling fluid.

Disposed between the flanged measuring tubes 13 to 23 and opening 4 is a vaporizer source 28. The locations where the two other vaporizer sources are arranged are indicated by the dashed circles 80 and 81 shown at the right side and the left side adjacent the vaporizer source 28. The vaporizer source 28 includes a front tube 29 and a rear tube 30. Both front and rear tubes 29, 30 are held together by connection clamps 37, 38, which are provided for receiving connection bolts. At the lower end of rear tube 30 are disposed two ports 32, 33, to which for example a power source can be connected. A cooling tube 36 is guided about rear tube 30, which is connected with cooling means port 39. Suspension hooks 34, 35 are provided, with which carrier plate 7 forming a door or carrier frame 8 can be raised.

Not shown in FIG. 1 is a mask, which is conventionally disposed parallel to the substrate 9, and specifically between substrate 9 and front plate 6. Since the mask is oriented vertically, the sagging due to gravity is excluded.

Substrate 9 is oriented vertically, i.e. parallel to the direction of the gravitational force of the earth. However, minor deviations from parallelity are permitted, i.e., the substrate is substantially parallel with the earth's gravity. The entire coating chamber 1 can, for example, for reasons not further explained here, be inclined by approximately 7.degree. with respect to the vertical. The invention prevents or minimizes sagging of potential masks. If the mask, due to an oblique position of the substrate 9 rests on the top side of this substrate 9, it cannot sag.

Figure 2:
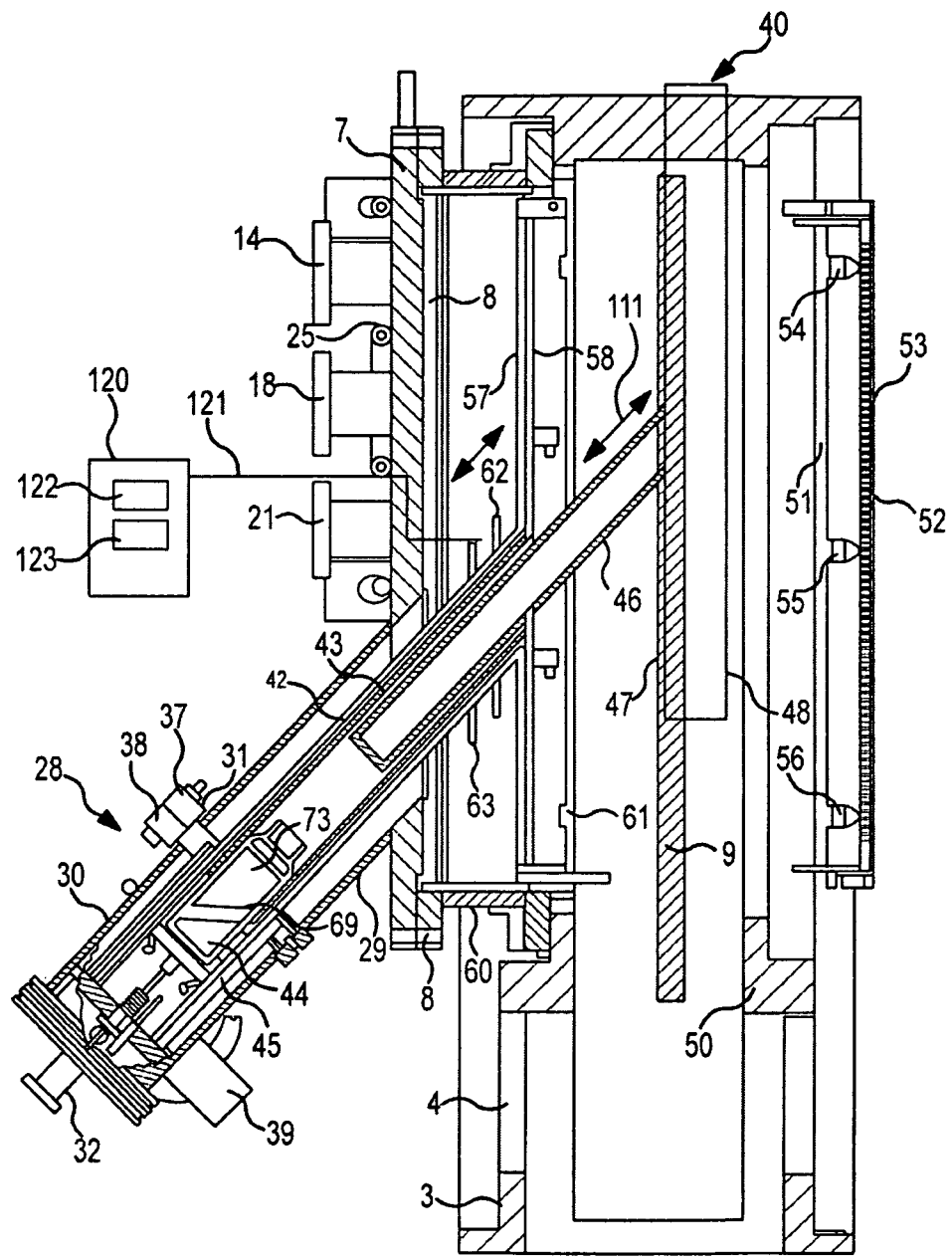
FIG. 2 a cross section through the chamber according to FIG. 1.

The sectional representation depicted in FIG. 2 shows carrier plate 7 with the measuring tubes and their flanges 14, 18, 21 as well as the substrate 9 and the tubes 29, 30 of the vaporizer source 28. Substrate 9 is for example a glass plate, which can be moved into the plane of drawing and out of it. The retention and the drive for this substrate 9 are not shown in FIG. 2.

The same applies to the retention and the drive of a mask, potentially on the left next to the substrate 9, which can cover the entire surface of substrate 9.

In the representation shown in FIG. 2 the distributor of the evaporated material formed by the quartz tube 40 is projecting into the movement path of substrate 9. This is only for the sake of explanation. However, in the situation of deposition the substrate 9 may freely move perpendicular to the plane of drawing.

Within tube 29 is disposed a ceramic tube 43, which is encompassed by a metal shielding tube 42. At the lower end of the ceramic tube 43 is provided a crucible 44, whose front portion connects to a quartz tube 46. In the representation of FIG. 2, this quartz tube 46 is pulled out such that the distance between its lower end and the crucible 44 is relatively large. The obliquely disposed quartz tube 46 transitions at its front end into the rear wall 47 of a vertically oriented quartz tube 40, which, on its side 48 facing away from the quartz tube 46, is provided with several holes disposed on a vertical line. These holes are depicted in further detail in FIG. 3.

The vertically disposed quartz tube 40 is encompassed by two halves 52, 58 of a ceramic tube, which, in the representation of FIG. 2, are pulled apart to the left and the right. In the assembled state and during operation, the two halves 52, 58 are brought together such that they form a tubular unit which encompasses the quartz tube 40. It is particularly preferred that quartz tube 40 is arranged in a plane parallel to the surface of the substrate.

The two halves 52, 58 of the ceramic tube are, in turn, encompassed by metal tube halves 53, 57. The halves 52, 53 of the ceramic tube or of the metal tube provided on the right side have holes at the same site as the vertical quartz tube 40. The holes of the three tubes are thus positioned one beyond the other and form a line source.

During operation, the lower end of quartz tube 46 is connected with crucible 44 such that the material vaporized from crucible 44 is conducted through the oblique quartz tube 46 into the vertical quartz tube 40, which is encompassed by ceramic halves 52, 58 and metal tube halves 53, 57. The vaporized material now is conducted through the vertically disposed holes of quartz tube 40 and through the holes of halves 52, 53 of the ceramic or the metal tube into the chamber in which the substrate 9 is disposed. Since these holes—in contrast to the representation of FIG. 2—during operation are disposed on the left of substrate 9, substrate 9 is acted upon with the vaporized material.

If a mask is disposed between the metal tube 53 and substrate 9, the vaporized material first reaches this mask before it arrives on substrate 9.

Past the line source, formed by the vertically disposed holes of quartz tube 40, of ceramic tube 52, 58 and of metal tube 53, 57 the substrate 9 is guided out of the plane of drawing or into the plane of drawing. In this way, the continuous coating of a large substrate area is possible.

The temperature of crucible 44 and the temperature of the distributor system containing tube 40 and 46, are regulated separately, and the precise regulation of the temperature for the range between 100.degree. and 800.degree. C. must be ensured. The entire distributor system succeeding the crucible 44 must be at a defined high temperature, which prevents condensation on surfaces exposed to the vapor, e.g., the walls of the coating chamber 1, walls of the distributor system, including tubes 40 and 46 bores or slots therein and corresponding bores or slots, but does not thermally decompose organic molecules. The uniformity of the temperature is best achieved through indirect heating by means of radiation. The homogeneity of the coating of substrate 9 is attained through a ratio, adapted to the vaporization rate, of the diameters of tubes 40, 46 to the area of the outlet opening comprised of many small holes or a slot. The outlet opening can advantageously be kept free of coating through specific tempering.

With the apparatus depicted in FIGS. 1 to 2 it is feasible to replenish coating material with only the crucible region needing to be vented. It is furthermore possible to bring the crucible 44 maintained under vacuum or protective gas to the distributor system without venting the crucible, the entire source or the installation.

Crucible 44 is divided by a partition wall 69 into an upper chamber 73 and into a lower chamber 45. In the upper chamber 73 is located the organic substance, which is to be vaporized. Which substance is involved here is shown, for example, in illustration 4 of the paper E. Becker et al: Organische Lumineszenz: Neue Technologie fur flache Bildschirme, Femseh- und Kino-Technik, 8-9/2000, pp. 1 to 5 or the components named in EP 1 197 576 A1 or EP 1 078 999 A2. Possible materials for the electron transport are in particular ($Alq_3$, PBD), for the light emission ($Alq_3$, 1-AZM-Hex, OXD-8, doping substances: Ph-Qd, DCM, $Eu(TTFA)_3Phen$) as well as for the hole transport (CuPc, TNATA, TAD, NPD). Other substances are also possible (cf. WO 99/25894, claim 6).

The crucible 44 is comprised of quartz glass. However, it is also possible to employ crucibles made out of metals like tantalum, molybdenum or tungsten as well as ceramics or graphite. It must be ensured in every case that the crucible 44 does not react chemically with the material disposed in it.

The distance between the front side 48 of tube 40 and substrate 9 during operation may be adjusted by movement of the quartz tube 40 and the accompanying metal and ceramic tubes 52, 58 and 53, 57 as well as of the metal tube 42 and ceramic tube 43 encompassing the quartz tube 46 along the direction shown by double arrow 111.

On the metal tube 42 flanged on obliquely with respect to the carrier plate 7 are disposed two adjusting aids 62, 63 which serve for the purpose of moving the metal tube 42 such that the distance between the line source and the substrate 9 is adjusted according to the command of the control unit 120. The control unit 120 is connected via a data and signal line 121 with a motor (not shown) which may drive the adjusting aids 62, 63 of the metal tube.

The control unit 120 comprises a storage unit 122 and a processing unit 123. The processing unit 123 controls the distance of the line source to the substrate 9 according to the method described above. Especially the control unit 120 calculates the positions of the vaporizers on the basis of the desired mixture in the deposited layer, for example the distances of the line sources disposed one after the other along the transport path of the substrate 9. Accordingly, the motors (not shown) for driving the adjusting aides 62, 63 of the different vaporizes are controlled to set the distance of the line sources as calculated. For this purpose the control unit uses the deposition conditions stored in the storage unit 123 for determining the appropriate distances of the line sources to the substrate 9. The deposition conditions considered during determination of the distance of the line sources to the substrate 9 comprise the type of the evaporation source (vaporizer), especially the form of the vaporizer (line source, point source, area source) including the type and form of the source openings, the deposition material, the deposition temperature, evaporation rate, etc. Especially, the tilting angle of the vaporizer with respect to the substrate is also considered while determining the distance of the line sources to the substrate. Alternatively, the tilting angle of the evaporation source is additionally set together with the distance of the line sources. Moreover, it is also possible only to set the tilting angle of the line sources (as described below) and to keep the distances of the line sources to the substrate at a predetermined value.

The tilting angle of the line source may be set by tilting the quartz tube 40, the ceramic tube 52 and the metal tube 53 containing the numerous bores 101, 102 and 103 serving as the openings of the line source.

Figure 3:
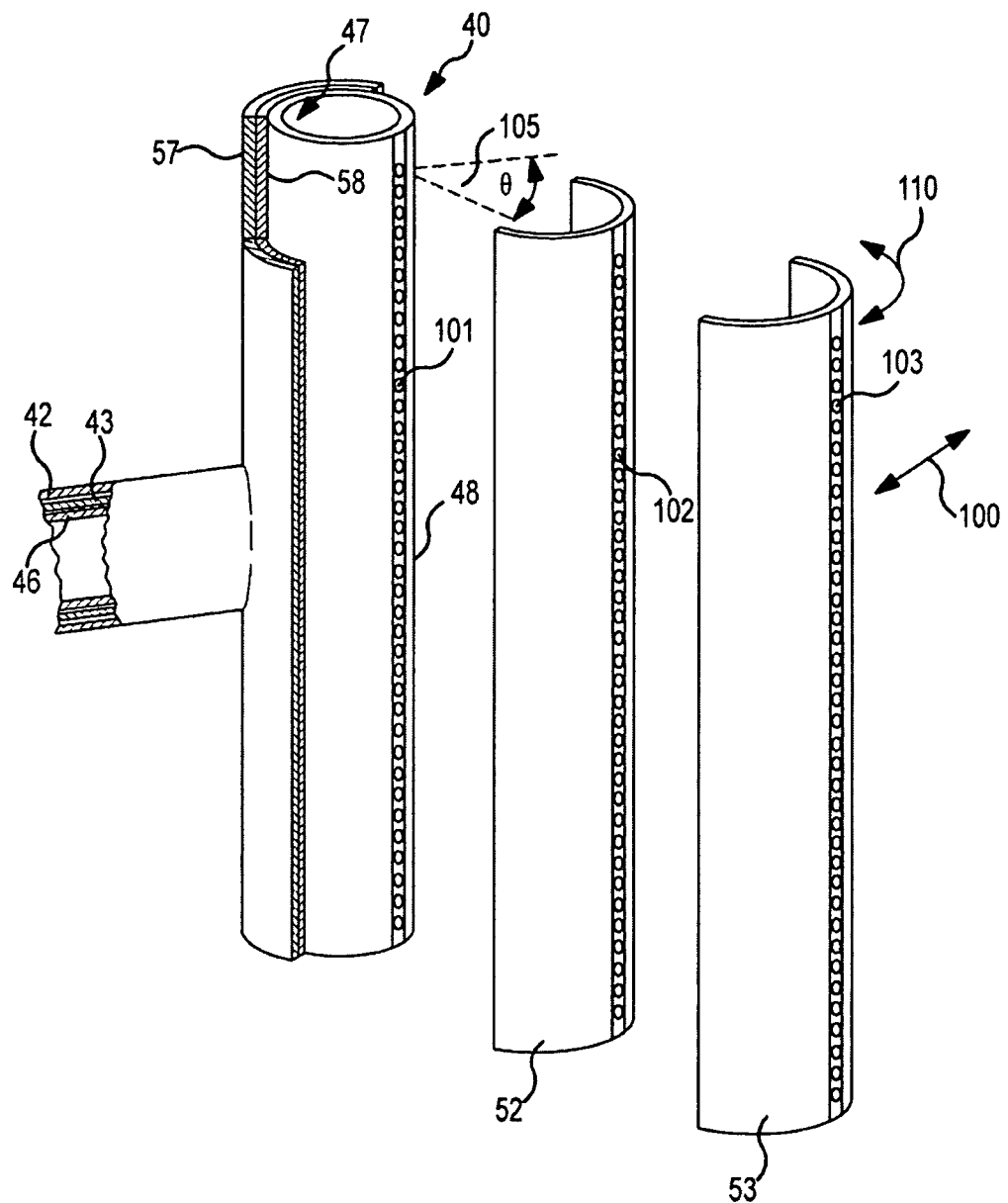
FIG. 3 a perspective exploded drawing of a distributor of an evaporation source for distributing the vaporized material.

FIG. 3 shows the distributor system, which distributes the material vaporized in crucible 44 onto the substrate. The one end of quartz tube 46 is connected with crucible 44, not shown here, while the other end of this quartz tube 46 terminates obliquely, i.e. approximately at an angle of 45°, in the quartz tube 40. About the quartz tube 46 is placed the ceramic tube 43, which in turn is encompassed by the metal tube 42. The ceramic and the metal tubes 43 or 42 are selected such that they do not enter into reaction with the vaporized material.

All three tubes 42, 43, 46, flanged on at an angle of approximately 45°, are partially shown in section. Tubes 42, 43 terminate in semitubes or half tubes 57, 58, which are comprised of the same material as they themselves are.

These semitubes 57, 58, shown in exploded view, are opposed by the ceramic semitube 52 and the metal semitube 53.

Semitubes 58 and 52 or 57 and 53, respectively, are connected with the aid of clamps or other connecting means, such that in the operating state the two quartz tubes 46 and 40 are each encompassed by one ceramic tube, which, in turn, is encompassed by a metal tube.

In order for the substrates, which are moved perpendicularly to the longitudinal axis of quartz tube 40 in the direction of arrow 100, to be acted upon by a line-form vaporizer source, in the quartz rube 40 as well as also in the ceramic semitube 52 and the metal semitube 53 numerous opposing bores 101, 102, 103 are provided, which together form a line source. By employing several bores disposed in a line, a better distribution of the vaporized material takes place in comparison to a longitudinal slot. This applies in particular to the quartz tube 40, where the initial distribution of the vaporized material takes place. It would be possible, however, for a continuous slot to be provided in the metal semitube 53, without the uniform distribution of the vaporized material being hereby significantly affected. However, also pure slots in the ceramic semitube 52 and/or the quartz tube 40 is in principle possible.

The openings 101, 102, 103 of the line source which are in the present embodiment single holes, define an evaporation direction which is parallel to the dashed line 105 shown in FIG. 3. The evaporation direction may thus be defined as the axis of an opening, like a hole, of an evaporation source or the direction perpendicular to the opening area. Taking the orientation of the evaporation direction perpendicular to the substrate area to be coated or the plane in which the substrate is moved as the basic orientation, the tilting angle Θ is defined by deviation of this basic orientation of the evaporation direction as shown in FIG. 3.

For setting the tilting angle of the evaporation line source shown in FIG. 1 to 3, the tubes 46, 52, 53 are rotated around the longitudinal axis of the tubes 46, 52, 53 as indicated by the double arrow 110. For driving the tubes 46, 52, 53 a further motor unit (not shown) may be disposed for rotational movement of the tubes. The motor unit (not shown) is also controlled by the control unit 120 shown in FIG. 2. Accordingly, the control unit may simultaneously adjust the distance of the line sources as well the tilting angle of the line sources in order to obtain the desired mixture of the deposited components in the layer. While the distance of line source to the substrate as well as tilting angle of the line source may be set independently from each other and as a single measure to obtain the desired mixture in the deposited layer, it is also possible that tilting angle and distance are set at the same time.

Figure 4:
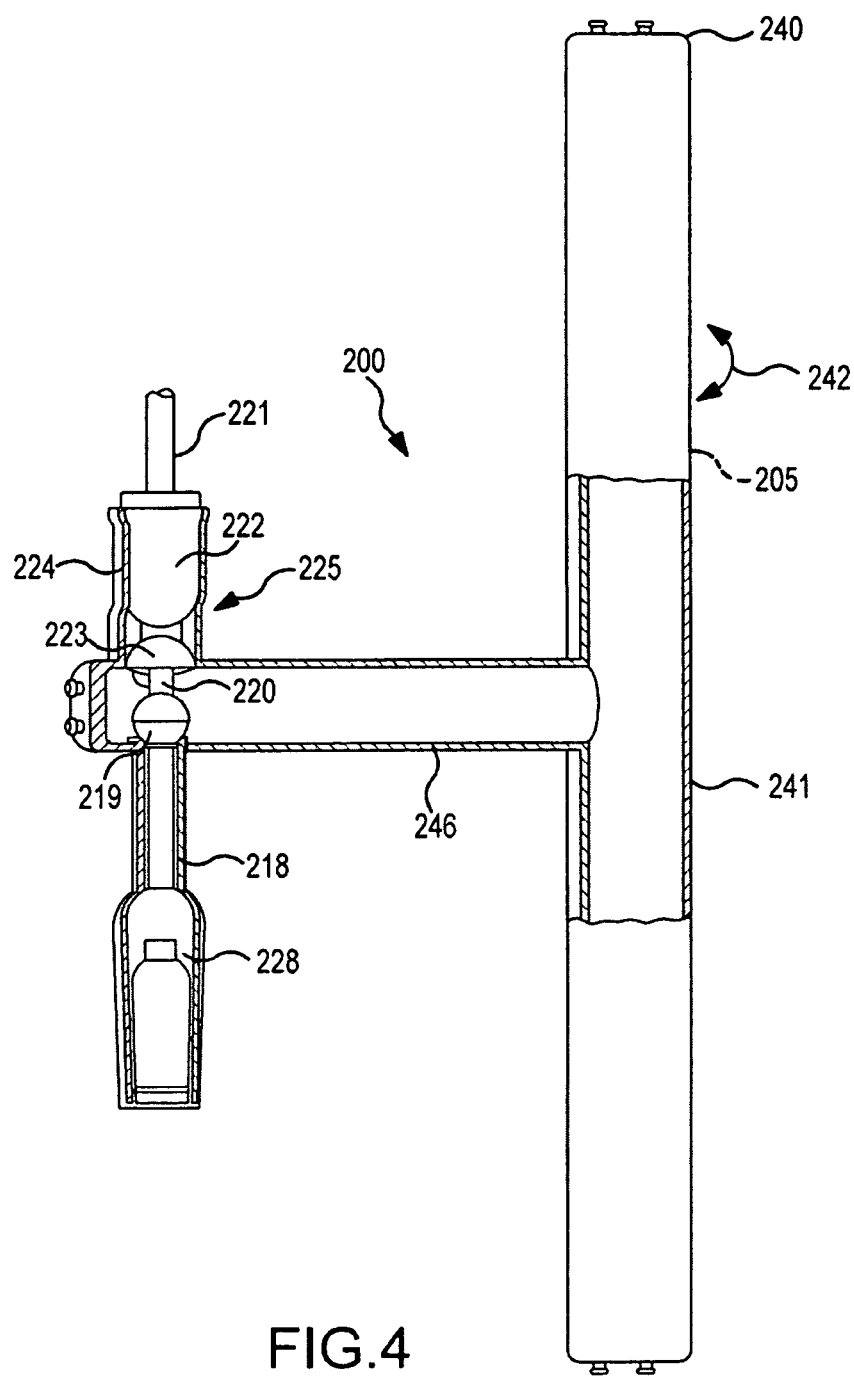
FIG. 4 a second embodiment of an evaporation source for use with the present invention.

A further evaporation source which may be used for the present invention is shown in FIG. 4. FIG. 4 shows a side view and a partial cross section of an evaporation source 200 which is based on a device disclosed in the European patent application EP 1 672 715 A1 which is completely incorporated herein by reference. The evaporation source of FIG. 4 designed for the inventive method as well as for the inventive apparatus of the present application differs from the device disclosed in EP 1 672 715 A1 with respect to the possibility of tilting adjustment of the orientation of the line source defined by the multiple dispensing openings 241 arranged in a line in the tube 240 of the distributor system. As indicated by the double arrow 242, the dispensing holes 241, i.e. the evaporation direction 205 which is identically defined as for the previous embodiment, may be rotated around the longitudinal axis of the tube 240 of the distribution system. Accordingly, two or more evaporation sources 200 disposed in a deposition apparatus of the present invention may be adjusted with respect to the tilting angle of the evaporation line source and/or the distance of the evaporation line source from the substrate. The distance from the evaporation line source 200 may be varied by movement along the longitudinal axis of the feeding tube 246 which is perpendicular to the tube 240 in the embodiment of FIG. 4.

The feeding tube 246 is connected to a further quartz tube 218, in which the vaporizer source 228 is accommodated, at its end opposite to the dispensing tube 240. The upper end of the quartz tube 218 is according to the illustration of FIG. 4 closed by a quartz glass ball 219 or any suitably formed component. The quartz glass ball 219 is connected to a quartz glass bar 220, 221 which is led through a plug 222, at the end of which a calotte 223 is disposed. These components are part of a valve 225 which allows opening and closing of the quartz tube 218 and therefore of the vaporizer source 228.

Figure 5:
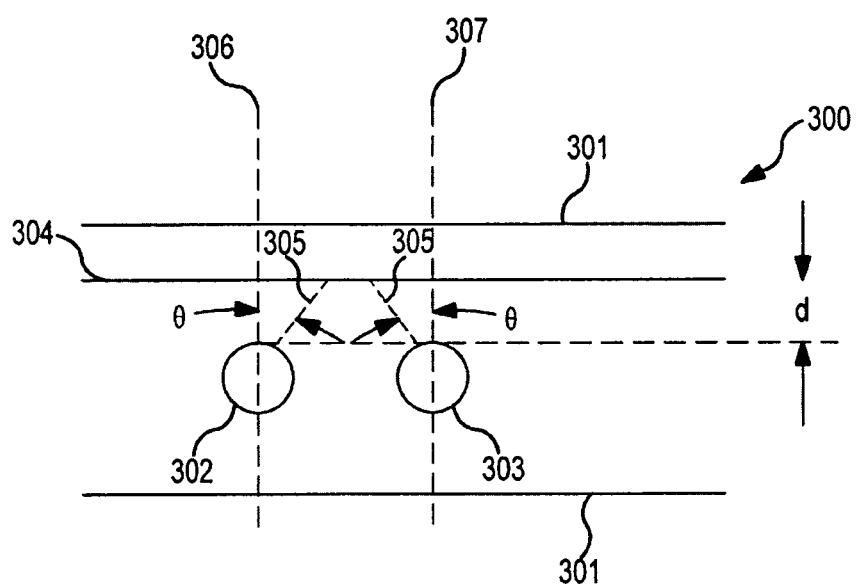
FIG. 5 an embodiment of an inventive apparatus.
Figure 6:
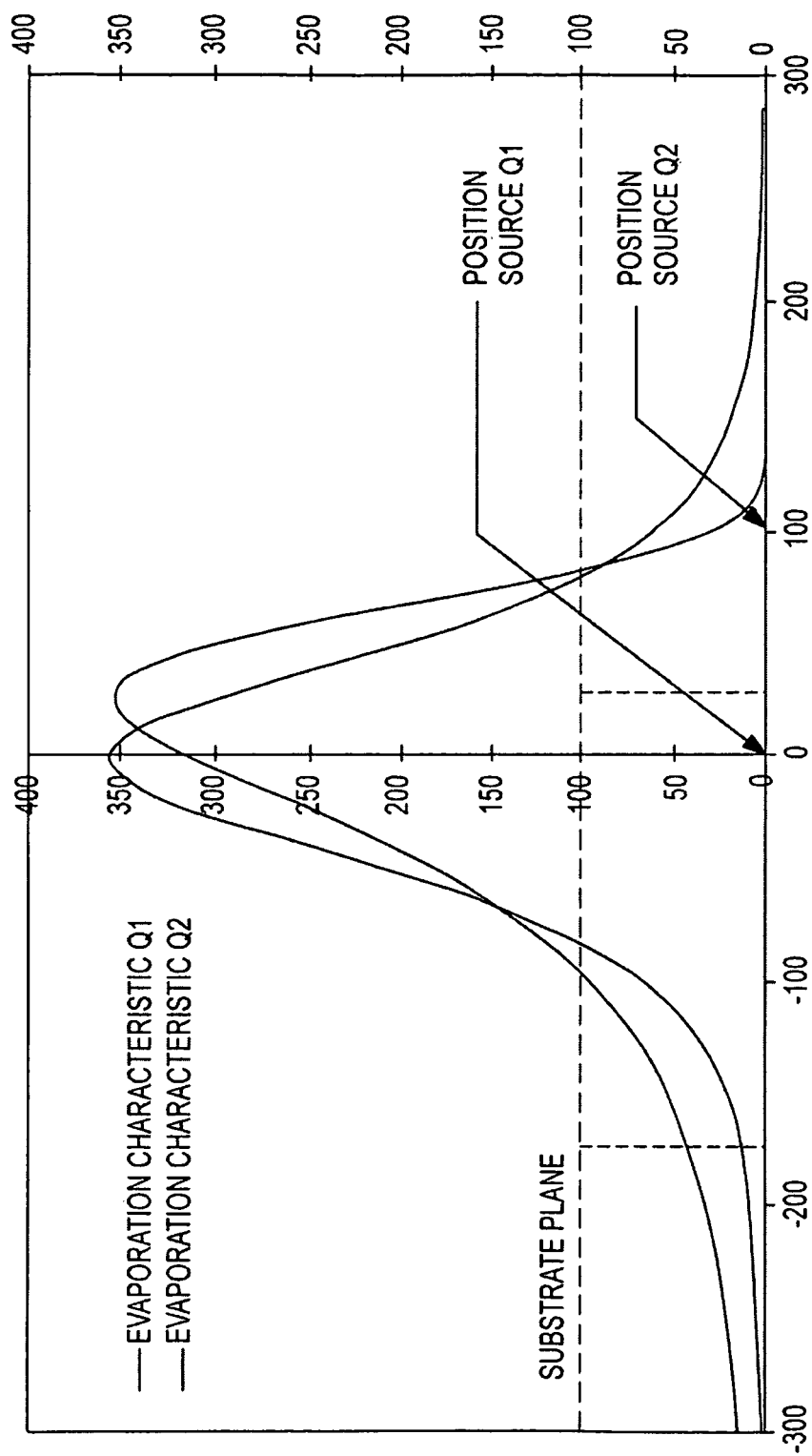
FIG. 6 a diagram showing the profile and the arrangement of evaporation plumes according to the invention; and in FIG. 7 a diagram showing the composition profile along the thickness of layer deposited by co-evaporation of two materials with a deposition rate ratio of 1:100 for a fixed angle between the two sources.

FIG. 5 shows a top view onto a section of an inventive apparatus comprising two evaporation sources.

The apparatus for depositing material onto a substrate 304 comprises a coating chamber, the opposing side walls 301 of which are shown in FIG. 5. The substrate 304 is oriented perpendicular to the plane of drawing and moves along the intersection line of the plane of drawing and the plane defined by the plate-like substrate 304. For example, the substrate 304 may be moved from the left to the right side of FIG. 5.

At a distance d from the surface of the substrate 304 to be coated the dispensing tubes 302 and 303 of evaporation sources are arranged. The remaining parts of the evaporation sources are omitted for the sake of clarity. However, evaporations sources as described before may be used in the apparatus shown in FIG. 5.

The distance d between the substrate and the evaporation sources or dispensing tubes may be varied by either movement of the tubes 302, 303 and/or variation of the substrate path.

The dispensing tubes 302 and 303 form a line source comprising a plurality of dispensing holes, the evaporation direction 305 of which is shown by the dashed lines. The longitudinal axis of the dispensing tubes 302 and 303 is oriented perpendicular to the plane of drawing.

The evaporation direction 305 is tilted by an angle θ around the longitudinal axis of the dispensing tubes 302, 303 from the zero position which is defined as being perpendicular to the substrate surface as shown by the dashed lines 306 and 307.

In FIG. 4, a diagram illustrating the profiles of evaporation plumes of two evaporation sources Q1 and Q2 is shown.

The x-axis of the diagram represents a direction parallel to the movement path of the substrate or the substrate plane, respectively. The substrate plane is shown as a dashed line parallel to the x-axis.

The y-axis represents a direction perpendicular to the x-.axis and is therefore perpendicular to the substrate plane. Accordingly, the y-axis corresponds to the evaporation direction in the basic configuration with a tilt angle of the evaporation source equal to 0. Moreover, the y-axis represents the distance of the evaporation source to the substrate. At the example shown in the diagram of FIG. 4 the substrate is at a distance of 100 with respect to the evaporation sources Q1 and Q2 while the evaporation sources Q1 and Q2 are located at positions 0 and 100 with respect to the x-axis. The profiles of the evaporation plumes correspond to a specific distribution curve, especially a cosn curve, and also correspond to the amount of material being present in the area and being encompassed by the profile of the evaporation plume. Accordingly, at the substrate plane intersecting the profile of the evaporation plume the amount of deposited material also corresponds to the profile of the evaporation plume. This means that for the evaporation source Q1 at the x-position 0 most of the material is deposited, while at the x-positions −100 and +100 a reduced amount of material according to the Distribution curve of the profile is deposited.

As can be seen from the diagram in FIG. 4, the profile of the evaporation plume of evaporation source Q1 is symmetrical with respect to the y-axis. However, the profile of the evaporation plume of the source Q2, which is laterally offset along the x-axis, is not symmetrical with respect to the y-axis. This is the result of the tilting angle Θ set for the evaporation source Q2. As a consequence, the evaporation maxima of the profiles of the evaporation plumes are separated. While the maximum of the profile originating from the evaporation source Q1 is located at the y-axis, the maximum of the evaporation source Q2 is laterally offset at a x-position of approximately 30.

Due to the separation of the evaporation maxima, the composition of the deposited layer with respect to the different components evaporated by the evaporation sources Q1 and Q2 can be controlled in a better way. Especially, the concentration of a dopant in an organic layer of an organic light emitting device, organic electronic device or an organic photovoltaic device can be increased. Perhaps, this is associated with regions of predominant deposition of one of the components in the coating area and subsequent diffusion processes.

In order to achieve a mixture of the deposited components and to avoid depletion of the layer with respect to one of the components in specific areas of the layer, the profiles of the evaporation plumes are arranged such that the intersection of the profiles of the evaporation plumes with the substrate plane coincide. Accordingly, as shown in FIG. 4 the evaporation plume of evaporation source Q2 exceeds the evaporation plume of evaporation source Q1 at the x-position −300. However, at the x-position −80 the evaporation plume of the evaporation source Q1 exceeds the evaporation plume of the evaporation source Q2 until both evaporation profiles intersect again at x-position 15. Then again until x-position 90 the evaporation plume of evaporation source Q2 exceeds the evaporation plume of evaporation source Q1 in y-direction. In this way a gradual variation of the composition of the co-evaporated components perpendicular to the substrate plane is generated.

Figure 7:
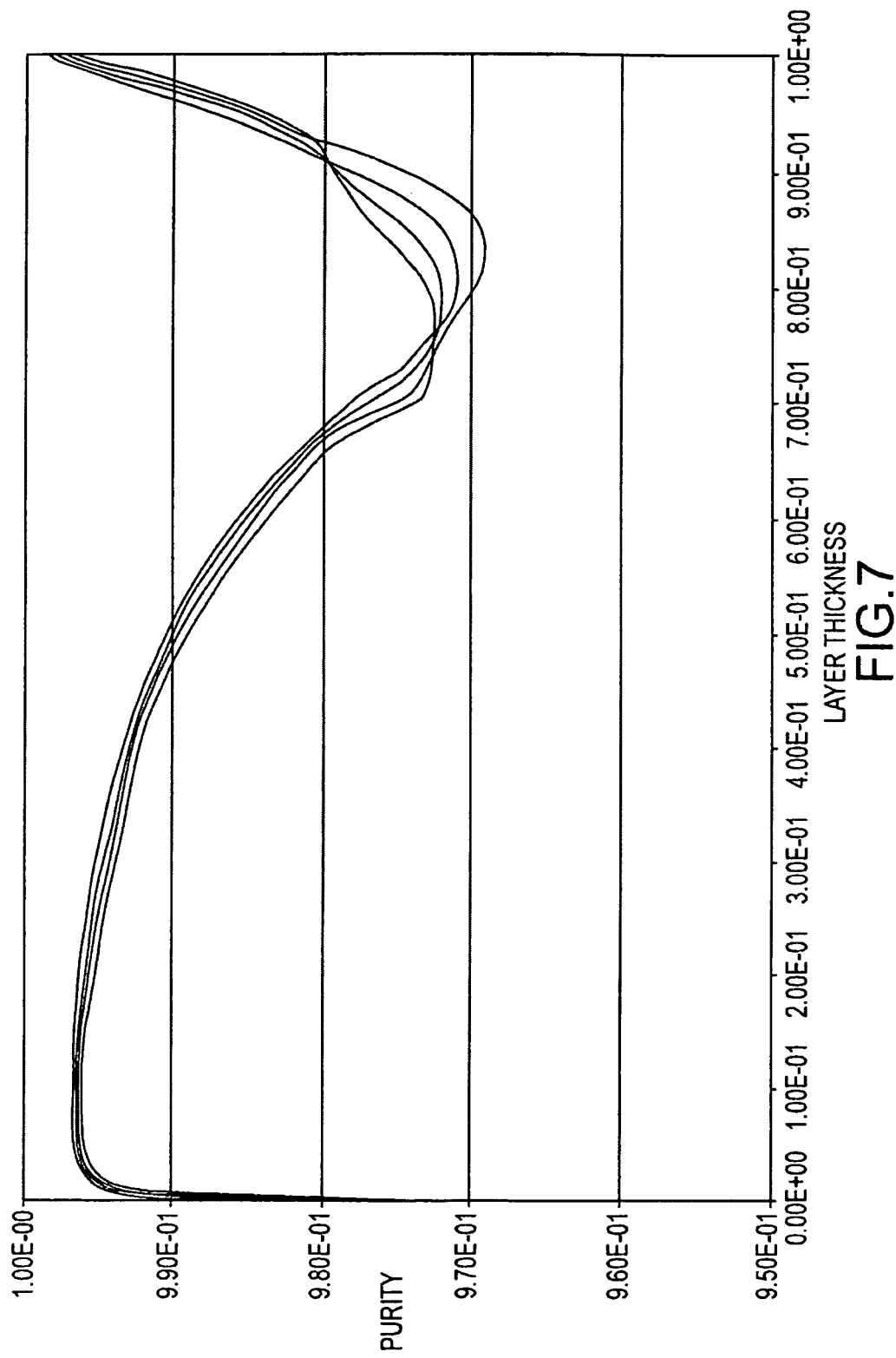

FIG. 7 shows a diagram with respect to the concentration profile across the thickness of the deposited layer. The diagram refers to the purity of the coated material which comprises a dopant in a concentration of 1%. By choosing the appropriate angle between the evaporation sources, different concentration profiles may be established.

Although the present invention has been described with respect to specific embodiments, it is evident for a man skilled in the art, that the present invention is not restricted to such embodiments, but covers variations of the invention including omitting specific features or combining the features in different ways as long as the scope of protection defined in the accompanying claims is not left. In particular, the present invention claims all possible combinations of single features described in this document.

What is claimed is:

1. Method for depositing a layer at a substrate, the layer containing at least two components co-deposited by at least two evaporation sources,
    wherein the mixture of the components regarding the content of the components is set by tilting the evaporation sources to a predetermined angle,
    wherein a concentration profile of the components in the layer is set by variation of the tilting angle of the evaporation sources during deposition,
    wherein the concentration profile of the components comprises a gradient with increasing or decreasing content of a specific component in the layer across a thickness of the layer,
    wherein setting the evaporation source is based on information with respect to at least one of the deposition condition selected from the group consisting of: type of evaporation source, geometry of evaporation source, position of evaporation source, evaporation material, evaporation rate, evaporation temperature and form of the evaporation plume.

2. Method according to claim 1, wherein evaporation plumes of the evaporation sources are arranged such that the maxima of the evaporation plumes are separated locally with respect to the substrate.

3. Method according to claim 2, wherein evaporation plumes of the evaporation sources are arranged such that profiles of the evaporation plumes intersect at the plane of the substrate and/or evaporation plumes of the evaporation sources are configured such that the profiles of the evaporation plumes are different.

4. Method according to claim 1, wherein a geometry of the evaporation source and/or a deposition rate of the evaporation source is chosen such that a desired mixture of the components in the layer is achieved.

5. Method according to claim 1, wherein a concentration profile of the components in the layer is set by periodical variation of the tilting angel during deposition.

6. Method according to claim 1, wherein for each component a single evaporation source is used and/or at least one organic material is evaporated.

7. Method according to claim 1, wherein a concentration profile of the components in the layer perpendicular to the substrate surface to be coated is set by tilting and/or spacing the evaporation sources.

8. Method according to claim 1, wherein the substrate passes the evaporation sources in a continuous movement during deposition.

9. Method according to claim 1, wherein the layer deposited is a layer of an organic light emitting diode (OLED) or of an organic photovoltaic device.

10. The method according to claim 1, wherein a concentration profile of the components in the layer is set by especially periodical variation of the distance during deposition.

11. The method according to claim 1, wherein the predetermined angle is adjusted depending on information with respect to at least one deposition conditions selected from the group consisting of: type of evaporation source, geometry of evaporation source, position of evaporation source, evaporation material, evaporation rate, evaporation temperature and form of the evaporation plume and/or the setting of the evaporation source is based on information stored in the control unit with respect to the deposition conditions.

12. The method according to claim 1, wherein the gradient includes multiple gradients having increasing or decreasing content of one or more components across the thickness of the deposited layer.

13. Apparatus for depositing a layer at a substrate, the apparatus comprising at least two evaporation sources for co-deposition of at least two components into the layer,
wherein the evaporation sources are adjustable with respect to the tilt angle,
wherein a control unit is provided which is configured to set a tilt angle of the evaporation sources to a predetermined angle and/or a distance of the evaporation sources with respect to the substrate for depositing a desired mixture of the components regarding the content of the components in the layer across a thickness of the layer during deposition,
wherein setting the evaporation source is based on at least one deposition condition selected from the group consisting of: type of evaporation source, geometry of evaporation source, position of evaporation source, evaporation material, evaporation rate, evaporation temperature and form of the evaporation plume.

14. Apparatus according to claim 13, wherein the evaporation sources being adjustable with respect to tilt angle and/or distance of the evaporation sources with respect to the substrate.

15. Apparatus according to claim 13, wherein the apparatus is designed to carry out the method of claim 1.

* * * * *